(12) United States Patent
Lee et al.

(10) Patent No.: US 11,762,245 B2
(45) Date of Patent: Sep. 19, 2023

(54) DISPLAY DEVICE

(71) Applicant: Samsung Display Co., Ltd., Yongin-Si (KR)

(72) Inventors: Yong Hee Lee, Suwon-si (KR); Dong Hee Shin, Asan-si (KR); Geun Ho Lee, Hwaseong-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 141 days.

(21) Appl. No.: 17/115,836

(22) Filed: Dec. 9, 2020

(65) Prior Publication Data

US 2021/0263382 A1 Aug. 26, 2021

(30) Foreign Application Priority Data

Feb. 25, 2020 (KR) .................. 10-2020-0022892

(51) Int. Cl.
| | | |
|---|---|---|
| *G02F 1/1343* | (2006.01) | |
| *G02F 1/1335* | (2006.01) | |
| *G02F 1/1362* | (2006.01) | |
| *H01L 27/12* | (2006.01) | |
| *G02F 1/1339* | (2006.01) | |

(52) U.S. Cl.
CPC .... *G02F 1/134309* (2013.01); *G02F 1/13394* (2013.01); *G02F 1/133512* (2013.01); *G02F 1/136222* (2021.01); *G02F 1/136286* (2013.01); *H01L 27/1244* (2013.01); *G02F 2201/121* (2013.01); *G02F 2201/123* (2013.01)

(58) Field of Classification Search
CPC ......... G02F 1/134309; G02F 1/133512; G02F 1/13394; G02F 1/136222; G02F 1/136286; G02F 1/136213; H01L 27/1244
See application file for complete search history.

(56) References Cited

U.S. PATENT DOCUMENTS

| | | | | |
|---|---|---|---|---|
| 2005/0264741 A1* | 12/2005 | Kim | .................. | G02F 1/136213 349/139 |
| 2007/0159571 A1* | 7/2007 | Yang | .................. | G02F 1/136259 349/54 |
| 2011/0096259 A1* | 4/2011 | Lee | ..................... | H01L 27/1255 445/24 |

(Continued)

FOREIGN PATENT DOCUMENTS

| | | | |
|---|---|---|---|
| KR | 10-2005-0108095 A | 11/2005 | |
| KR | 10-2007-0007597 A | 1/2007 | |

(Continued)

*Primary Examiner* — Mariam Qureshi
(74) *Attorney, Agent, or Firm* — Innovation Counsel LLP

(57) ABSTRACT

An exemplary embodiment of the present inventive concept provides a display device including: a first substrate; a gate line; a storage electrode; a data line insulated from the gate line and the storage electrode line and extending along a second direction; a drain electrode disposed on a same layer as the data line to include an contact pad; a first electrode electrically connected to the drain electrode; a second substrate overlapping the first substrate; and a light blocking layer disposed on the second substrate to have an opening exposing the first electrode, wherein an edge of a region of the storage electrode line in the second direction and an edge of the contact pad of the drain electrode in the second direction are disposed on a line extending in the first direction.

19 Claims, 6 Drawing Sheets

(56) References Cited

U.S. PATENT DOCUMENTS

| | | | |
|---|---|---|---|
| 2011/0149183 A1* | 6/2011 | Cho | G02F 1/13394 |
| | | | 349/38 |
| 2011/0156165 A1* | 6/2011 | Jang | H01L 27/1214 |
| | | | 257/389 |
| 2013/0037814 A1* | 2/2013 | Oh | H01L 27/1288 |
| | | | 438/34 |
| 2016/0161788 A1* | 6/2016 | Wu | G02F 1/133512 |
| | | | 445/24 |
| 2017/0031195 A1* | 2/2017 | Chen | G02F 1/133512 |
| 2017/0261796 A1* | 9/2017 | Tamaki | G02F 1/133553 |
| 2018/0252969 A1* | 9/2018 | Long | H01L 29/41733 |

FOREIGN PATENT DOCUMENTS

| | | |
|---|---|---|
| KR | 10-1193448 B1 | 10/2012 |
| KR | 10-1675372 B1 | 11/2016 |
| KR | 10-1855389 B1 | 5/2018 |

\* cited by examiner ically connected to the drain electrode to the contact pad; a second substrate overlapping the first substrate; and a light blocking layer disposed on the second substrate, the light blocking layer including an opening which exposes the first electrode, wherein an edge of the storage electrode line extending along the first direction and disposed adjacent to the first electrode in the second direction and an edge of the contact pad of the drain electrode extending along the first direction and disposed adjacent to the first electrode in the second direction are disposed on a line which extends in the first direction in a plan view.

DISPLAY DEVICE

CROSS-REFERENCE TO RELATED APPLICATION

This application claims priority to and benefits of Korean Patent Application No. 10-2020-0022892, filed in the Korean Intellectual Property Office on Feb. 25, 2020, the entire contents of which are incorporated herein by reference.

BACKGROUND

(a) Technical Field

The present disclosure relates to a display device, and more particularly, to a display device capable of preventing light leakage.

(b) Description of the Related Art

A liquid crystal display, which is one of display devices that are currently widely used, is a display device that applies a voltage to electrodes (pixel electrode and common electrode) formed on two substrates facing each other to control an arrangement of liquid crystal molecules of a liquid crystal layer disposed therebetween, thereby controlling an amount of transmitted light.

Such a liquid crystal display includes a thin film transistor connected to electrodes. The thin film transistor is used as a switching element for independently driving each pixel in the liquid crystal display.

Specifically, the thin film transistor is a switching element that controls a data signal supplied to a pixel electrode through a data line in response to a gate signal supplied through a gate line from each pixel, and includes a gate electrode connected to the gate line, a semiconductor layer disposed on the gate electrode to constitute a channel, a source electrode disposed on the semiconductor layer to be connected to the data line, and a drain electrode spaced apart from the source electrode with the semiconductor layer disposed therebetween.

A display device that is bendable has been recently used, but misalignment between two substrates of the display device may occur in a bending process.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a display device capable of preventing light leakage even when upper and lower plates are misaligned.

An exemplary embodiment of the present inventive concept provides a display device including: a first substrate; a gate line disposed on the first substrate and extending along a first direction; a storage electrode disposed on a same layer as the gate line; a data line insulated from the gate line and the storage electrode line and extending along a second direction that is perpendicular to the first direction; a drain electrode disposed on a same layer as the data line, the drain electrode including a contact pad; a first electrode electrically connected to the drain electrode to the contact pad; a A distance between the edge of the storage electrode line and the edge of the contact pad of the drain electrode may be less than 10 μm in the second direction.

An edge of the light blocking payer is disposed on the line which extends in the first direction.

A distance between the edge of the light blocking layer, the edge of the storage electrode line, and the edge of the contact pad of the drain electrode in the second direction may be less than 10 μm.

The display device further including a spacer dispose on the first electrode.

A difference between a width of the first electrode in the first direction and a width of the spacer in the first direction may be 20% or less.

The storage electrode line may include: a first storage electrode line and a second storage electrode line extending along the first direction and spaced apart from each other with the first electrode disposed therebetween; a third storage electrode line and a fourth storage electrode line extending along the second direction to connect the first storage electrode line and the second storage electrode line; and a fifth storage electrode line connecting the first storage electrode line to the third storage electrode line and the fourth storage electrode line, wherein the fifth storage electrode line and the contact pad of the drain electrode overlap each other in a plan view.

Each of the third storage electrode line and the fourth storage electrode line may include a region extending along the first direction.

A width of the region extending along the first direction in each of the third storage electrode line and the fourth storage electrode line may be 8 μm or more.

Edges of the third storage electrode line and the fourth storage electrode line extending along the first direction and disposed adjacent to the first electrode in the second direction and the edge of the contact pad of the drain electrode extending along the first direction and disposed adjacent to the first electrode in the second direction may be disposed on the line which extends in the first direction in a plan view.

The storage electrode line may have a first groove and a second groove disposed at opposite edges of the fifth storage electrode line in the first direction.

A length of the first groove and the second groove in the second direction may be 8 μm or more.

The fifth storage electrode line may have a third groove disposed at the edge of the fifth storage electrode line disposed adjacent to the first electrode in the second direction.

A length of the third groove in the second direction may be in a range of 2 μm to 3 μm.

A distance between an edge of the space in the second direction and an edge of the opening in the second direction may be in a range of 5 μm to 10 μm.

The display device may further include a color filter disposed between the drain electrode and the first electrode, and a spacer disposed on the first electrode. The color filter may have an opening exposing the contact pad of the drain electrode, and the spacer may cover the opening in a plan view.

The contact pad of the drain electrode and the region of the storage electrode line may be spaced apart from each other in the first direction.

The spaced distance may be in a range of 2 μm to 3 μm.

The first electrode may include: a stem portion extending along the second direction; fine branch portions extending from the stem portion; and a protrusion connected to the drain electrode, and the protrusion and the stem portion may be spaced apart from each other on the second direction.

The gate line may include: a first gate line and a second gate line disposed side by side in the first direction; and a gate electrode connecting the first gate line and the second gate line, and the spacer overlaps the gate electrode in a plan view.

According to the exemplary embodiments, it is possible to provide a display device capable of preventing light leakage even when upper and lower plates are misaligned.

DETAILED DESCRIPTION OF THE EMBODIMENTS

Figure 1:
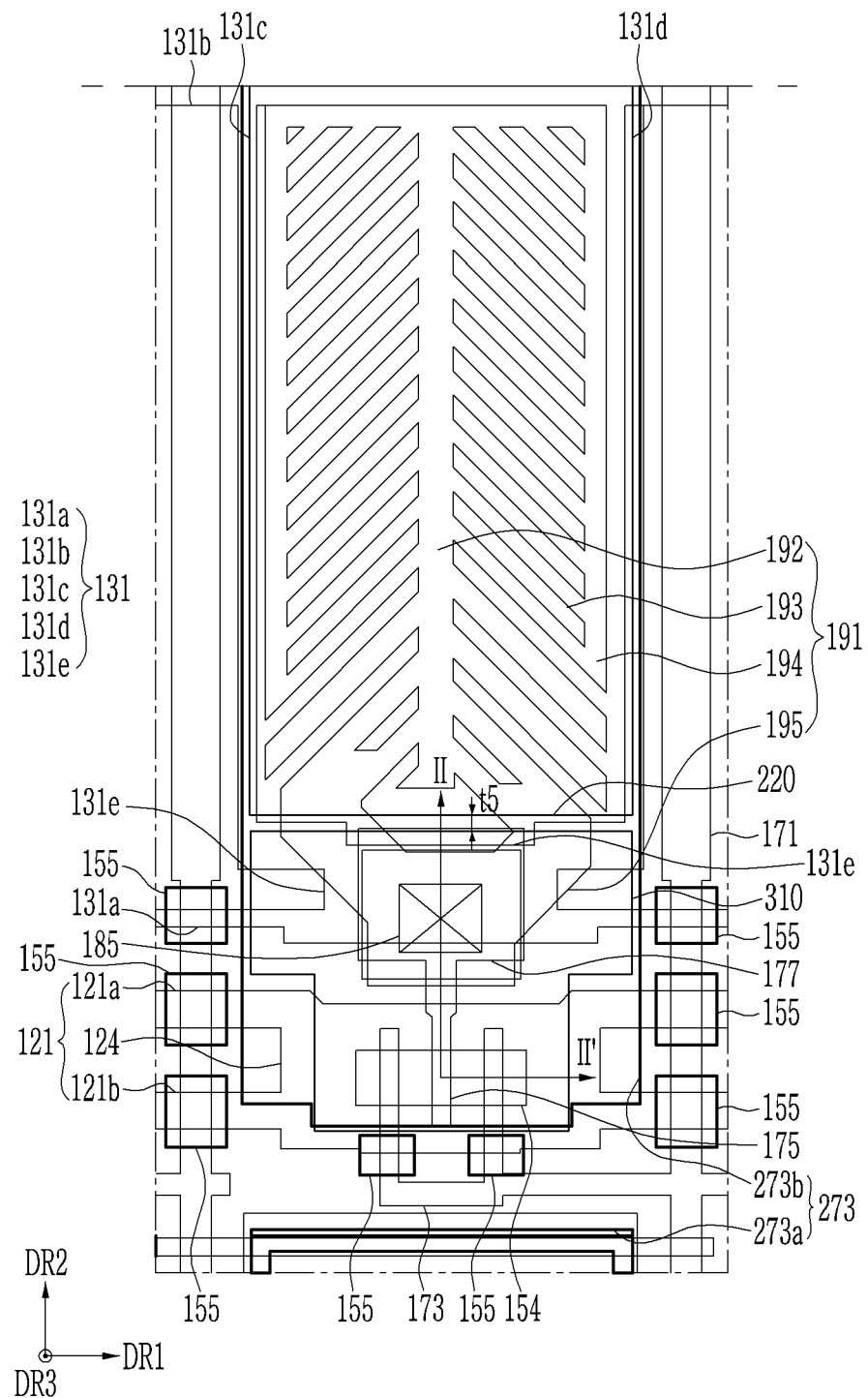
FIG. 1 illustrates a layout view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Hereinafter, a display device according to an exemplary embodiment of the present inventive concept will be described in detail with reference to drawings.

Figure 2:
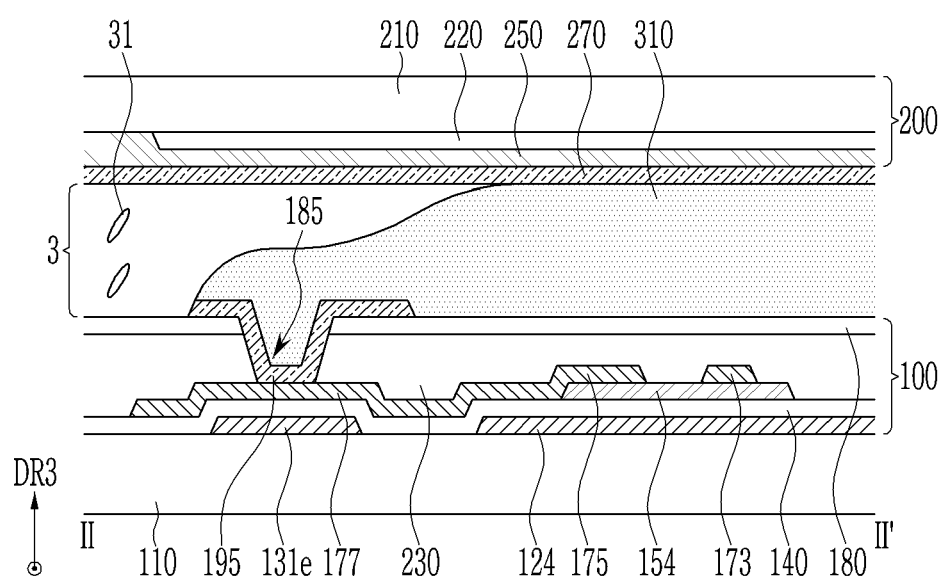
FIG. 2 illustrates a cross-sectional view taken along a line II-II' of FIG. 1.

FIG. 1 illustrates a layout view of a display device according to an exemplary embodiment of the present inventive concept. FIG. 2 illustrates a cross-sectional view taken along a line II-II' of FIG. 1. The display device according to the exemplary embodiment of the present inventive concept will be described with reference to both FIG. 1 and FIG. 2.

Referring to FIG. 1 and FIG. 2, the display device includes a first display panel 100 and a second display panel 200 facing each other, and a liquid crystal layer 3 disposed therebetween.

First, the first display panel 100 will be described. Referring to FIG. 1 and FIG. 2, the first display panel 100 includes a gate line 121 disposed on a first substrate 110 which is made of transparent glass or plastic.

The gate line 121 transfers a gate signal and extends in a first direction DR1. The gate line 121 may include a first gate line 121a and a second gate line 121b disposed parallel to each other. The first gate line 121a and the second gate line 121b may be connected to a gate electrode 124. Hereinafter, although described separately, a semiconductor layer 154, a source electrode 173, and a drain electrode 175 are disposed on the gate electrode 124 to constitute a transistor.

Referring to FIG. 1 and FIG. 2 simultaneously, a storage electrode line 131 is disposed on a same layer as the gate line 121. The storage electrode line 131 may be formed in a same process as the gate line 121, and may include a same material.

The storage electrode line 131 includes a first storage electrode line 131a disposed in parallel with the first direction DR1 and to be adjacent to the gate line 121, a second storage electrode line 131b disposed in parallel to the first direction DR1 with a first electrode 191 disposed between the first storage electrode line 131a and the second storage electrode line 131b, a third storage electrode line 131c and a fourth storage electrode line 131d disposed in parallel with a second direction DR2 to connect the first storage electrode line 131a and the second storage electrode line 131b, and a fifth storage electrode line 131e disposed to connect the first storage electrode line 131a, the third storage electrode line 131c, and the fourth storage electrode line 131d and to overlap an contact pad 177 of the drain electrode 175 in a third direction DR3.

In the present specification, for convenience of description, the storage electrode line 131 is explained as it includes the first storage electrode line 131a, the second storage electrode line 131b, the third storage electrode line 131c, the fourth storage electrode line 131d, and the fifth storage electrode line 131e, but the storage electrode lines may be connected with each other and may not be separated from each other. In the drawing, for convenience of description, boundaries between storage electrode lines are indicated by dotted lines, but this is for convenience of description, and does not indicate that the storage electrode lines have separate configurations.

Figure 3:
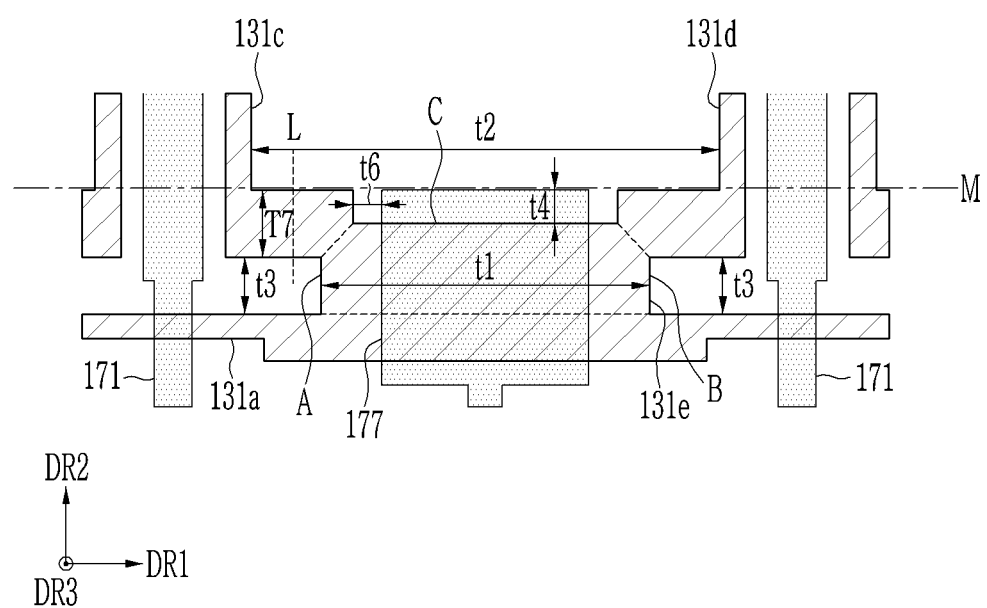
FIG. 3 illustrates a storage electrode line, a data line, and a contact pad for a drain electrode in the display device of FIG. 1.

FIG. 3 illustrates only the storage electrode line 131, a data line 171, and the contact pad 177 of the drain electrode in the display device of FIG. 1.

A shape of the storage electrode line 131 according to an exemplary embodiment of the present inventive concept will be described with reference to FIG. 1 to FIG. 3.

The first storage electrode line 131a extends in the first direction DR1, and is connected to a first storage electrode line (not illustrated) of a neighboring pixel. In the present specification, the pixel area refers to an area illustrated in FIG. 1, i.e., an area defined by two gate line 121s neighboring in the first direction DR1 and two data lines 171 neighboring in the second direction DR2. That is, the area is an area including one first electrode 191, a transistor for driving the same, and wires (gate line, data line, etc.) for configuring the transistor.

The first storage electrode line 131a is disposed between the first electrode 191 and the gate line 121 and extends in the first direction DR1.

The second storage electrode line 131b also extends in the first direction DR1 and is connected with the second storage electrode line 131b of a neighboring pixel. As such, the first storage electrode line 131a and the second storage electrode line 131b are both connected with the storage electrode lines of neighboring pixels, and thus, when a short circuit occurs in a portion of the storage electrode line 131, the portion of the storage electrode line may be cut off and repaired. Since the storage electrode line 131 is connected to the neighboring pixels through the first storage electrode line 131a and the second storage electrode line 131b, even when one line is disconnected, a voltage may be transferred to the other uninterrupted storage electrode line in a repair process.

The first storage electrode line 131a and the second storage electrode line 131b may be spaced apart in the second direction DR2 with the first electrode 191 disposed therebetween.

The third storage electrode line 131c extends along the second direction DR2 to connect the first storage electrode line 131a and the second storage electrode line 131b to each other. The third storage electrode line 131c may be disposed between the data line 171 and the first electrode 191. One edge of the third storage electrode line 131c may be bent and extends parallel to the first direction DR1. A width t7 of an area in the second direction DR2 in which the third storage electrode line 131c extends along the first direction DR1, may be 8 μm or more. This will be explained in detail later, but an area of the third storage electrode line 131c extends along the first direction DR1 has a light blocking function when a misalignment occurs between the upper and lower plates, and thus this is a minimum width range that is sufficiently light-blockable when considering alignment errors in a manufacturing process.

The fourth storage electrode line 131d also extends along the second direction DR2 to connect the first storage electrode line 131a and the second storage electrode line 131b to each other. The fourth storage electrode line 131d may be disposed between a data line 171 and a first electrode 191. One edge of the fourth storage electrode line 131d may be bent and extends parallel to the first direction DR1. A width t7 of an area in the second direction DR2 in which the fourth storage electrode line 131d extends along the first direction DR1, may be 8 μm or more. An area of the fourth storage electrode line 131d extends along the first direction DR1 has a light blocking function when a misalignment occurs between the upper and lower plates, and thus this is a minimum width range that is sufficiently light-blockable when considering alignment errors in a manufacturing process.

The third storage electrode line 131c and the fourth storage electrode line 131d may be disposed with the first electrode 191 disposed therebetween in the first direction DR1.

That is, upper, lower, left, and right surfaces of the first electrode 191 may be completely surrounded by the first storage electrode line 131a, the second storage electrode line 131b, the third storage electrode line 131c, and the fourth storage electrode line 131d. However, at least a portion of the upper, lower, left, and right surfaces of the first electrode 191 may not be completely surrounded by the first storage electrode line 131a, the second storage electrode line 131b, the third storage electrode line 131c, and the fourth storage electrode line 131d.

The fifth storage electrode line 131e connects the first storage electrode line 131a, the third storage electrode line 131c, and the fourth storage electrode line 131d. A width t1 of the fifth storage electrode line 131e in the first direction DR1 may be smaller than a width of the first electrode 191 in the first direction DR1. That is, the width of the fifth storage electrode line 131e in the first direction DR1 is shorter than a distance t2 between the third storage electrode line 131c and the fourth storage electrode line 131d in the first direction DR1.

Therefore, as illustrated in FIG. 3, the storage electrode line 131 includes grooves at opposite sides of the fifth storage electrode line 131e. The grooves disposed at opposite sides of the fifth storage electrode line 131e are respectively referred to as a first groove A and a second groove B. In this case, a length t3 in the second direction DR2 of the first groove A and the second groove B may be 8 μm or more. In this way, the storage electrode line 131 may be repaired in a space secured through the first groove A and the second groove B. That is, when a short circuit occurs between the storage electrode line 131 and the data line 171, the storage electrode line 131 may be cut and repaired as illustrated by a line L in FIG. 3. Even in this case, the first storage electrode line 131a is connected with neighboring pixels, so it does not affect the transmission of a voltage. When the lengths t3 of the first groove A and the second groove B in the second direction DR2 are 8 μm or more, a portion of the storage electrode line 131 may be effectively cut. When the length t3 of the first groove A and the second groove B in the second direction DR2 is less than 8 μm, other areas not intended may be cut in the process of cutting the storage electrode line 131.

In addition, a third groove C is disposed at one edge of the fifth storage electrode line 131e in the second direction DR2. That is, an outermost edge of the fifth storage electrode line 131e in the second direction DR2 is disposed closer to the first storage electrode line 131a than outermost edges of the third storage electrode line 131c and the fourth storage electrode line 131d which extends parallel to the first direction DR1.

That is, the third groove C is disposed between an area where the third storage electrode line 131c and the fourth storage electrode line 131d are connected to the fifth storage electrode line 131e.

As illustrated in FIG. 3, the storage electrode line 131 includes the third groove C recessed in the second direction DR2. Although it will be described in detail later, the contact pad 177 of the drain electrode 175 may be disposed to be partially overlapped with the third groove C. When the sustain electrode line 131 includes the third groove C, although a position of the drain electrode 175 changes due to the misalignment, an entire area where the drain electrode 175 and the storage electrode line 131 overlap is maintained. Therefore, a charging voltage of the display device may be stably maintained. A length t4 of the third groove C in the second direction DR2 may be in a range of 2 μm to 3 μm.

Referring back to FIG. 1 and FIG. 2, a gate insulating layer 140 is disposed on the gate line 121 and the storage electrode line 131. The gate insulating layer 140 may include a silicon oxide or a silicon nitride. The gate insulating layer 140 may have a multilayer structure including at least two insulating layers having different physical properties.

A semiconductor layer 154 is disposed on the gate insulating layer 140. The semiconductor layer 154 may be disposed to overlap the gate electrode 124. Referring to FIG. 1, a plurality of semiconductor patterns 155 are disposed on a same layer as the semiconductor layer 154. The semiconductor pattern 155 may be disposed at a point where the gate line 121 or the storage electrode line 131 and data line 171 cross each other. A short circuit may occur in an area where the data line 171 passes over the gate line 121 or the storage electrode line 131. In this case, when the semiconductor pattern 155 is disposed in the crossing area as illustrated in FIG. 1, the possibility of a short circuit may be reduced by gently compensating steps of the wires by the semiconductor patterns 155.

The data line 171 extends along the second direction DR2. The data line 171 transfers a data signal, and extends in the second direction DR2 to intersect the gate line 121. The source electrode 173 may extend from the data line 171 to overlap the gate electrode 124 and may have a substantially U-shape.

The drain electrode 175 is spaced apart from the data line 171 and extends upward from a center of the U shape of the source electrode 173. The drain electrode 175 includes the contact pad 177 connected with the first electrode 191. The contact pad 177 of the drain electrode overlaps the storage electrode line 131. In particular, it is disposed to overlap the fifth storage electrode line 131e of the storage electrode lines 131.

One gate electrode 124, one source electrode 173, and one drain electrode 175 form one transistor together with the semiconductor layer 154, and a channel region of the transistor is formed in the semiconductor layer 154 between the source electrode 173 and the drain electrode 175.

Referring to FIG. 3, one edge of the contact pad 177 of the drain electrode extending along the first direction DR1 and disposed adjacent to the first electrode 191 and edges of the third storage electrode line 131c and the fourth storage electrode line 131d extending along the first direction DR1 and disposed adjacent to the first electrode 191 are disposed on a same line extending along the first direction DR1.

That is, as illustrated in FIG. 3, one edge of the contact pad 177 of the drain electrode extending along the first direction DR1 and disposed adjacent to the first electrode 191 and edges of the third storage electrode line 131c and the fourth storage electrode line 131d extending along the first direction DR1 and disposed adjacent to the first electrode 191 are disposed on a same line extending along the first direction DR1 are disposed on the same virtual dotted line M.

Therefore, although it will be described in detail later, even when positions of the light blocking members are changed by the misalignment of the upper and lower plates of the display device, the storage electrode line 131 and the contact pad 177 of the drain electrode may be disposed on the same line, thereby preventing light leakage. That is, the storage electrode line 131 and the contact pad 177 of the drain electrode constitutes a large-area light blocking unit in the first direction DR1, and thus even when a misalignment occurs between the upper and lower plates, light leakage may be prevented.

In the present specification, the meaning of being disposed on the same line indicates that a shortest distance between the edges and the virtual dotted line M is 10 μm or less. That is, considering errors that may occur in the process, when a distance between the one edge of the contact pad 177 of the drain electrode extending along the first direction DR1 and disposed adjacent to the first electrode 191 and the edges of the third storage electrode line 131c and the fourth storage electrode line 131d extending along the first direction DR1 and disposed adjacent to the first electrode 191 is 10 μm or less, they may be considered to be disposed on the same line.

In addition, referring to FIG. 3, portions of the contact pad 177 of the drain electrode 175 and the storage electrode line 131 are spaced apart a distance t6 in the first direction DR1. The distance t6 may be in a range of 2 μm to 3 μm. In this way, since the drain electrode 175 and the storage electrode line 131 are partially separated in the first direction DR1, even when positions thereof change during formation of the drain electrode 175, a storage voltage of the display device may be maintained to be the same.

Next, a plurality of color filters 230 are disposed on the data line 171. The color filters 230 may include a red color filter, a green color filter, and a blue color filter. Each of the color filters may be disposed in the pixel area which is defined by two adjacent gate lines 121 and two adjacent data lines 121.

Next, an insulating layer 180 is disposed. The insulating layer 180 may be made of an inorganic insulator such as a silicon nitride or a silicon oxide, an organic insulator, or a low dielectric constant insulating material. For example, the insulating layer 180 may be an organic layer, and a thickness of the organic layer may be in a range of 2 μm to 3 μm. The insulating layer 180 may prevent a material of the color filter 230 from being diffused into the liquid crystal layer 3. However, the insulating layer 180 may be omitted according to an exemplary embodiment.

The insulating layer 180 and the color filters 230 include an opening 185 overlapping the drain electrode 175. A first electrode 191 is physically and electrically connected to the drain electrode 175 through the opening 185, and a data voltage is applied from the drain electrode 175 to the first electrode 191.

The first electrode 191 may include a transparent conductor such as ITO or IZO.

The first electrode 191 may include a stem portion 192 extending in the second direction and fine branch portions 193 extending from the stem portion. Edges of the fine branch portions 193 may be connected to each other by an outer portion 194. The first electrode 191 may include a protrusion 195 overlapping the contact pad 177 of the drain electrode 175, and may be connected to the contact pad 177 of the drain electrode 175 at the protrusion 195.

Some of the fine branch portions 193 of the first electrode 191 may not be connected to the outer portion 194. In addition, the protrusion 195 and the stem portion 192 of the first electrode 191 may be spaced apart from each other. This is a structure for improving an orientation of a liquid crystal at an edge of the first electrode 191.

The first electrode 191 may be a pixel electrode, and may receive a pixel voltage from a drain electrode.

Referring to FIG. 1, a shielding electrode 273 is disposed on a same layer as the first electrode 191. The shielding electrode 273 includes a first shielding electrode 273*a* disposed along the first direction DR1 and a second shielding electrode 273*b* disposed along the second direction DR2.

The second shielding electrode 273*b* may be disposed to overlap the data line 171 in the third direction DR3. The first shielding electrode 273*a* may be disposed to overlap a portion of the data line 121 in the third direction DR3.

A spacer 310 is disposed on the first electrode 191. The spacer 310 may be disposed while filling a recessed space caused by the opening 185 formed in the color filters 230 and the insulating layer 180. Therefore, it is possible to prevent the liquid crystal from being disoriented by a step made by the opening 185 in a region near the opening 185.

Figure 4:
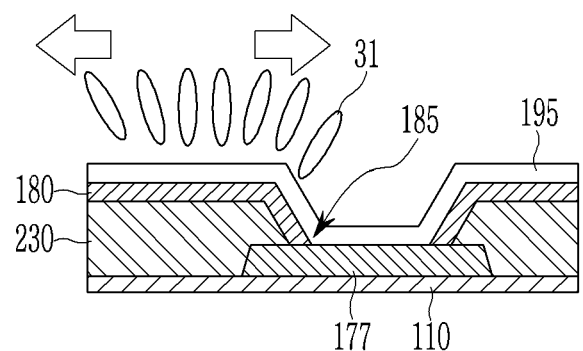
FIG. 4 briefly illustrates an orientation of liquid crystal molecules when a spacer does not fill an opening.
Figure 5:
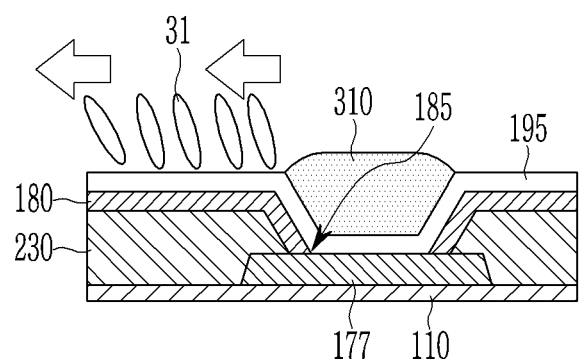
FIG. 5 illustrates an orientation of liquid crystal molecules when a spacer fills an opening according to an exemplary embodiment.
Figure 6:
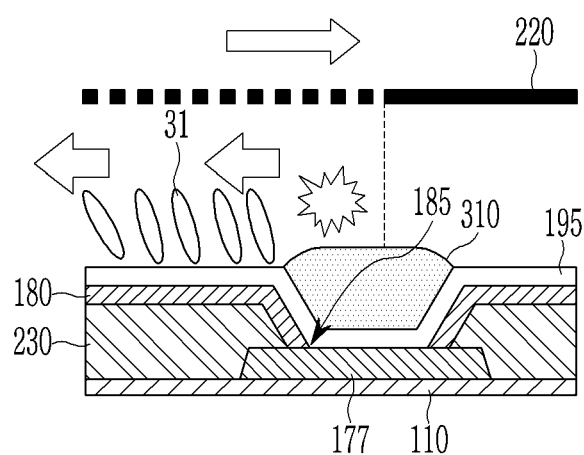
FIG. 6 illustrates a principle showing how light leakage occurs when upper and lower plates are misaligned.

FIG. 4 briefly illustrates an orientation of liquid crystal molecules 31 when the spacer 310 does not fill the opening 185. In FIG. 4 to FIG. 6, for better comprehension and ease of description, only some constituent elements are briefly illustrated.

Referring to FIG. 4, an orientation direction of the liquid crystal molecules 31 is changed due to a step difference of the opening 185. FIG. 4, the orientation directions that are different from each other are shown by arrows.

FIG. 5 illustrates an orientation of liquid crystal molecules when the spacer 310 fills the opening 185 according to an exemplary embodiment. As illustrated in FIG. 5, when the spacer 310 fills an empty space of the opening 185, the liquid crystal molecules 31 may be entirely evenly oriented. That is, in the present exemplary embodiment, it can be confirmed that the liquid crystal molecules 31 are oriented in a same direction.

Referring to FIG. 1, a width of the spacer 310 in the first direction DR1 may be similar to that of the first electrode 191 in the first direction DR1. In the present specification, the meaning of similarity indicates that the difference is 20% or less. Since the width of the spacer 310 in the first direction DR1 and the width of the first electrode 191 in the first direction DR1 are similar, the disorientation of most of the liquid crystal molecules 31 oriented on the first electrode 191 may be prevented. That is, the spacer 310 may prevent the liquid crystal molecules 31 from being oriented in the opposite direction, and may increase the display quality of the display device.

Next, the second display panel 200 will be described with reference to FIG. 1 and FIG. 2. The second display panel 200 includes a light blocking member 220 disposed on a second substrate 210 made of transparent glass or plastic. The light blocking member 220 has an opening in a region overlapping the first electrode 191 of the first display panel 100. In FIG. 1, the light blocking member 220 is disposed to overlap the data line 171, the gate line 121, and the like, and is disposed not to overlap most of the first electrode 191.

Referring to FIG. 1, a distance t5 between one edge of the light blocking member 220 extending parallel to the first direction DR1 and one edge of the spacer 310 extending parallel to the first direction DR1 is in a range of 5 to 10 µm. This takes into account alignment errors that may occur in a manufacturing process of the spacer 310.

In addition, referring to FIG. 1, one edge of the light blocking member 220 extending parallel to the first direction DR1, one edge of the contact pad 177 of the drain electrode extending along the first direction DR1 and disposed adjacent to the first electrode 191 and the edges of the third storage electrode line 131*c* and the fourth storage electrode line 131*d* extending along the first direction DR1 and disposed adjacent to the first electrode 191 may be disposed on a same line. The meaning of the same line is the same as described above. That is, the meaning of the same line means that a shortest distance therebetween the edges and the line is 10 µm or less. Therefore, although it will be described later, even when a position of the opening of the light blocking member 220 is changed by the misalignment between the upper and lower plates, light may be blocked by the storage electrode line 131 and the contact pad 177 of the drain electrode to prevent light leakage.

Next, an overcoat 250 is disposed on the light blocking member 220. The overcoat 250 may be omitted according to an exemplary embodiment. A second electrode 270 may be disposed on the overcoat 250. The second electrode 270 may be a common electrode, and may receive a common voltage.

A liquid crystal layer 3 includes liquid crystal molecules 31. The liquid crystal molecules 31 of the liquid crystal layer 3 may be oriented by a voltage between the first electrode 191 and the second electrode 270 to display an image.

As such, in the display device according to the present exemplary embodiment, one edge of the light blocking member 220 extending parallel to the first direction DR1, one edge of the contact pad 177 of the drain electrode extending along the first direction DR1 and disposed adjacent to the first electrode 191 and the edges of the third storage electrode line 131*c* and the fourth storage electrode line 131*d* extending along the first direction DR1 and disposed adjacent to the first electrode 191 may be are disposed on a same line. Therefore, even when a position of the opening of the light blocking member 220 is changed by the misalignment between the upper and lower plates, light may be blocked by the storage electrode line 131 and the contact pad 177 of the drain electrode to prevent light leakage.

FIG. 6 illustrates a principle showing how light leakage occurs when upper and lower plates are misaligned. In FIG. 6, the opening of the light blocking member 220 is illustrated by a dotted line. As illustrated in FIG. 6, when the position of the opening of the light blocking member 220 is changed by the misalignment between the lower panel and the upper panel, the spacer 310 may be exposed as illustrated in FIG. 6. Since the spacer 310 is formed of an organic material, which is not able to block light, light leakage occurs in a corresponding area.

However, in the display device according to the present exemplary embodiment, as illustrated in FIG. 1 and FIG. 3, the edge of the opening of the light blocking member 220, the edge of the storage electrode line 131, and the edge of the contact pad 177 of the drain electrode 175 are disposed on a same line. Therefore, even when the position of the opening of the light blocking member 220 is changed by the misalignment between the upper and lower plates, light may be blocked by the storage electrode line 131 and the contact pad 177 of the drain electrode 175 to efficiently prevent light leakage.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a first substrate;
a gate line disposed on the first substrate and extending along a first direction;
a storage electrode line disposed on a same layer as the gate line;
a data line insulated from the gate line and the storage electrode line and extending along a second direction that is perpendicular to the first direction;
a drain electrode disposed on a same layer as the data line, the drain electrode including a contact pad;
a first electrode electrically connected to the drain electrode to the contact pad;
a spacer disposed on the first electrode;
a second substrate overlapping the first substrate; and
a light blocking layer disposed on the second substrate, the light blocking layer including an opening which exposes the first electrode,
wherein an edge of the storage electrode line extending along the first direction and disposed directly adjacent to a center of the first electrode in the second direction, and an edge of the contact pad of the drain electrode extending along the first direction and disposed directly adjacent to the center of the first electrode in the second direction are disposed on a line which extends in the first direction in a plan view, and
wherein the spacer completely overlaps the first electrode in the second direction.

2. The display device of claim 1, wherein a distance between the edge of the storage electrode line and the edge of the contact pad of the drain electrode is less than 10 μm in the second direction.

3. The display device of claim 1, wherein an edge of the light blocking layer is disposed on the line which extends in the first direction.

4. The display device of claim 3, wherein a distance between the edge of the light blocking layer, the edge of the storage electrode line, and the edge of the contact pad of the drain electrode in the second direction is less than 10 μm.

5. The display device of claim 1, wherein a difference between the maximum width of the first electrode in the first direction and the maximum width of the spacer in the first direction is 20% or less.

6. The display device of claim 1, wherein the storage electrode line includes:
a first storage electrode line and a second storage electrode line extending along the first direction and spaced apart from each other with the first electrode disposed therebetween;
a third storage electrode line and a fourth storage electrode line extending along the second direction to connect the first storage electrode line and the second storage electrode line; and
a fifth storage electrode line connecting the first storage electrode line to the third storage electrode line and the fourth storage electrode line, and
wherein the fifth storage electrode line and the contact pad of the drain electrode overlap each other in a plan view.

7. The display device of claim 6, wherein each of the third storage electrode line and the fourth storage electrode line includes a region extending along the first direction.

8. The display device of claim 7, wherein a width of the region extending along the first direction in each of the third storage electrode line and the fourth storage electrode line is 8 μm or more.

9. The display device of claim 7, wherein edges of the third storage electrode line and the fourth storage electrode line extending along the first direction and disposed adjacent to the first electrode in the second direction and the edge of the contact pad of the drain electrode extending along the first direction and disposed adjacent to the first electrode in the second direction are disposed on the line which extends in the first direction in a plan view.

10. The display device of claim 6, wherein the storage electrode line has a first groove and a second groove disposed at opposite edges of the fifth storage electrode line in the first direction.

11. The display device of claim 10, wherein a length of the first groove and the second groove in the second direction is 8 μm or more.

12. The display device of claim 6, wherein the fifth storage electrode line has a third groove disposed at the edge of the fifth storage electrode line disposed adjacent to the first electrode in the second direction.

13. The display device of claim 12, wherein a length of the third groove in the second direction is in a range of 2 μm to 3 μm.

14. The display device of claim 1, wherein a distance between an edge of the spacer and an edge of the opening in the second direction is in a range of 5 μm to 10 μm.

15. The display device of claim 1, further comprising:
a color filter disposed between the drain electrode and the first electrode; and
a spacer disposed on the first electrode,
wherein the color filter has an opening exposing the contact pad of the drain electrode and the spacer covers the opening in a plan view.

16. The display device of claim 1, wherein the contact pad of the drain electrode and a portion of the storage electrode line are spaced apart from each other in the first direction.

17. The display device of claim 16, wherein the spaced distance is in a range of 2 μm to 3 μm.

18. The display device of claim 1, wherein the first electrode includes:
a stem portion extending along the second direction;
fine branch portions extending from the stem portion; and
a protrusion connected to the drain electrode, and
wherein the protrusion and the stem portion are spaced apart from each other in the second direction.

19. The display device of claim 1, further comprising a spacer dispose on the first electrode,
wherein the gate line includes:
a first gate line and a second gate line disposed side by side in the first direction; and
a gate electrode connecting the first gate line and the second gate line, and
wherein the spacer overlaps the gate electrode in a plan view.

* * * * *